US00RE36229E

United States Patent [19]

Cady

[11] E Patent Number: Re. 36,229

[45] Reissued Date of Patent: Jun. 15, 1999

[54] SIMULCAST STANDARD MULTICHIP MEMORY ADDRESSING SYSTEM

[75] Inventor: James W. Cady, Austin, Tex.

[73] Assignee: Staktek Corporation, Austin, Tex.

[21] Appl. No.: 08/510,729

[22] Filed: Nov. 20, 1995

Related U.S. Patent Documents

Reissue of:

[64] Patent No.: 5,371,866
Issued: Dec. 6, 1994
Appl. No.: 08/891,609
Filed: Jun. 1, 1992

[51] Int. Cl.[6] ..... G06F 12/06; G11C 7/00; G11C 8/00

[52] U.S. Cl. ..... 711/211; 365/193; 365/222; 365/230.02; 365/230.03; 365/63

[58] Field of Search ..... 365/193, 230.03, 365/230.06, 63, 52; 361/392, 393, 413; 439/44, 69; 395/421.01, 405

[56] References Cited

U.S. PATENT DOCUMENTS

| | | | |
|---|---|---|---|
| 4,884,237 | 11/1989 | Mueller et al. | 365/63 |
| 4,992,984 | 2/1991 | Busch et al. | 365/200 |
| 5,005,157 | 4/1991 | Catlin | 365/193 |
| 5,126,910 | 6/1992 | Windsor | 365/52 |
| 5,227,995 | 7/1993 | Klink et al. | 365/63 |
| 5,228,132 | 7/1993 | Neal et al. | 395/425 |
| 5,229,960 | 7/1993 | De Givry | 365/63 |
| 5,252,857 | 10/1993 | Kane et al. | 439/69 X |
| 5,257,233 | 10/1993 | Schaefer | 365/193 X |
| 5,279,029 | 1/1994 | Burns | 29/856 |
| 5,394,010 | 2/1995 | Tazawa et al. | 257/686 |

*Primary Examiner*—Jack A. Lane
*Attorney, Agent, or Firm*—J. Scott Denko; Fulbright & Jaworski, L.L.P.

[57] ABSTRACT

The memory addressing system of the present invention incorporates industry standard features for compatibility and adds the capability of using high-density module memory boards exclusively or in combination with current or next generation standard memory modules without increasing system power requirements. The system provides a plurality of standardized memory module circuit board sockets that are electrically connected so as to provide address decoded RAS signals in addition to the standard row and column addressing signals.

12 Claims, 2 Drawing Sheets

SIMULCAST STANDARD MULTICHIP MEMORY ADDRESSING SYSTEM

Matter enclosed in heavy brackets [ ] appears in the original patent but forms no part of this reissue specification; matter printed in italics indicates the additions made by reissue.

BACKGROUND OF THE INVENTION

This invention relates to electronic data processing systems, and in particular to memory addressing subsystems having a need for relatively large amounts of addressable random access memory (RAM). This invention has particular utility in providing enhanced, flexible RAM expansion capacities by providing the equivalent of next generation monolithic RAM devices packaged in modules of standardized form such as Single-In-Line-Memory-Modules (SIMMs) at a much earlier point in time (typically three years) using current generation RAM devices packaged in high density, multichip memory modules such as Stakpak™ which are then packaged in the same standardized form modules. This achievement is done without significantly increasing power requirements (same number of active devices per memory cycle) or requiring system reconfiguration. Furthermore, the interface is designed in such a way that when next generation RAM devices become available, they can be packaged in the same standardized form modules and plugged into the same sockets as the high density multichip modules.

DISCUSSION OF THE RELATED ART

As personal and business use of stand-alone or networked electronic data processing systems has increased, they are accompanied by more sophisticated software or applications programming, many of which are imposing ever increasing demands for additional fast random access memory.

Many of the advances in system design related to enhancements in the primary processor or CPU, as well as the addition of coprocessors, memory controllers, enhanced busses and bus controllers, cache memories and the like. Advances in the microprocessors from the Intel 80286 to the 80386, 80486, for example, have provided increased capabilities to address memory, and the demand for speed has created an ever increasing demand for more high speed RAM space that can be accessed much faster than peripheral memory devices such as hard disks.

Memory expansion boards have been utilized to allow the expansion of high speed RAM available to the CPU. Memory expansion boards include circuitry necessary to interface expanded memory to the processor via a system bus. Expansion boards typically include industry-standard sockets adapted to receive one or more memory modules. One such standard package is known as a Single-In-Line-Memory-Module (SIMM). Standard package memory boards utilize a plurality of individual memory packages, such as one megabyte or four megabyte chips, assembled on to a small printed circuit board having a terminal edge portion for connection into a socket provided on the memory expansion board.

A significant limitation in prior art memory expansion systems relates to the number of sockets that are provided for memory modules and the power supply available on the system to energize the memory devices. Most systems provide sufficient power supply capability to effectively energize a predetermined maximum number of RAM devices. Often times, the computer system has the capability to address and utilize more memory than either the number of sockets or its power supply will support. Thus, a memory system limitation is imposed that is lower than that imposed by the CPU and system architecture.

A memory capacity upgrade for these systems is, thus, dependent upon the availability of the next generation RAM memory technology which will usually increase capacity in the same volume by a factor of four without significantly increasing power.

It is important in the computer industry to maintain component interconnect compatibility. This permits users and designers to upgrade systems using standardized interconnect configurations and to design hardware and software knowing that certain industry standard address schemes, for example, will be used in standard systems. One such standard is the use of row then column address multiplexing circuitry between the system bus and RAM arrays. In this scheme, typically a memory controller circuit, including an address register and a timing and control circuit to provide a row address strobe (RAS) and column address strobe (CAS) signal interfaces with the system bus to permit the CPU and other system devices to address main memory. System main memory is typically an array of dynamic random access memories, arranged in individual device or modular form.

Depending on the size of the system memory, provision is typically made in the memory address register for a larger number of address lines or pins than required by the system to permit expansion. Expansion requires the capability of decoding more memory addresses than presently provided in the system. Typically, more address pins are installed than required to address current system requirements to permit both expansion and the use of certain "reserved" pins for design features and future uses.

Another area of standardization is in the provision of standardized sockets on expansion circuit boards to receive memory modules. It is desirable to provide standardized sockets to enable users to obtain modules from more than one source. Until recently, most memory modules were configured to include an array of single element DRAM devices, such as one megabit chips with each DRAM surface mounted to the module circuit board. The module circuit board was provided with an edge-mount interconnect portion which was plugged into a socket on the expansion board. The number of pins or interconnects provided to the module circuit board and socket was standardized to accommodate typical multiplexed addressing and power requirements.

Recently, memory fabrication technology has advanced to provide multiple element memory devices in vertical "stacks" to form, for example, a module comprising four or more one megabit DRAMs sharing the same socket or surface mount on the module circuit board. This new technology is the subject of copending U.S. patent application Ser. No. 07/561,417, commonly owned by the assignee hereof, the contents of which are incorporated herein by reference.

These new multiple-element memory devices permit quadrupling the amount of memory available in the memory modules without increasing the number of sockets or space requirements for a given module circuit board. Many present day systems are unable to take full advantage of this increased memory capacity due to system power supply limitations.

The simulcast memory addressing system of the present invention provides a novel way of overcoming and avoiding the power supply limitation and provides a new standard memory interconnect and addressing configuration that permits the designer or user to freely substitute and intermix next generation standard module memory circuit boards with the new high-density module memory boards.

SUMMARY OF THE INVENTION

The memory addressing system of the present invention incorporates industry standard features for compatibility and adds the capability of using high-density module memory boards exclusively or in combination with current or next generation standard memory modules without increasing system power requirements. The system provides a plurality of standardized memory module circuit board sockets that are electrically connected so as to provide address decoded RAS signals in addition to the standard row and column addressing signals. This "simulcast" addressing scheme allows the 4× capacity, next generation memory modules such as SIMMs and 4× capacity high-density memory modules, such as Stakpaks™ to be plugged into the same socket and operate with the same number of active devices in a given memory cycle. This dual configuration capability permits the interchange or simultaneous use of next generation or high-density modules such as Stakpaks™ mounted in memory module circuit boards, like SIMMs.

In addition to the high-density memory module sockets, the system of the present invention also includes a new decoding circuit which works in conjunction with the industry standard memory interface circuitry such as an address register and timing and control circuitry. This additional decoder provides the ability to decode or select which one of four or more "levels" on the high-density stacked memory module is to be addressed during any given address cycle thereby limiting the power requirements for high-density modules to the same level required by single density standard modules.

In a typical four-high stack system, the decoder is a standard 2:4 circuit which uses any two available address lines from the memory address register and the industry standard row address strobe (RAS) to selectively energize one of four levels in the stack. For convenience and in keeping with industry custom, usually the two address lines corresponding to the two most significant or two least significant address bits are used to provide the necessary decoding. These two bits are then reserved for programming use only when the computer system is equipped with either the high-density memory devices or the next generation memory devices or SIMMs.

DESCRIPTION OF THE PREFERRED EMBODIMENT

Figure 1:
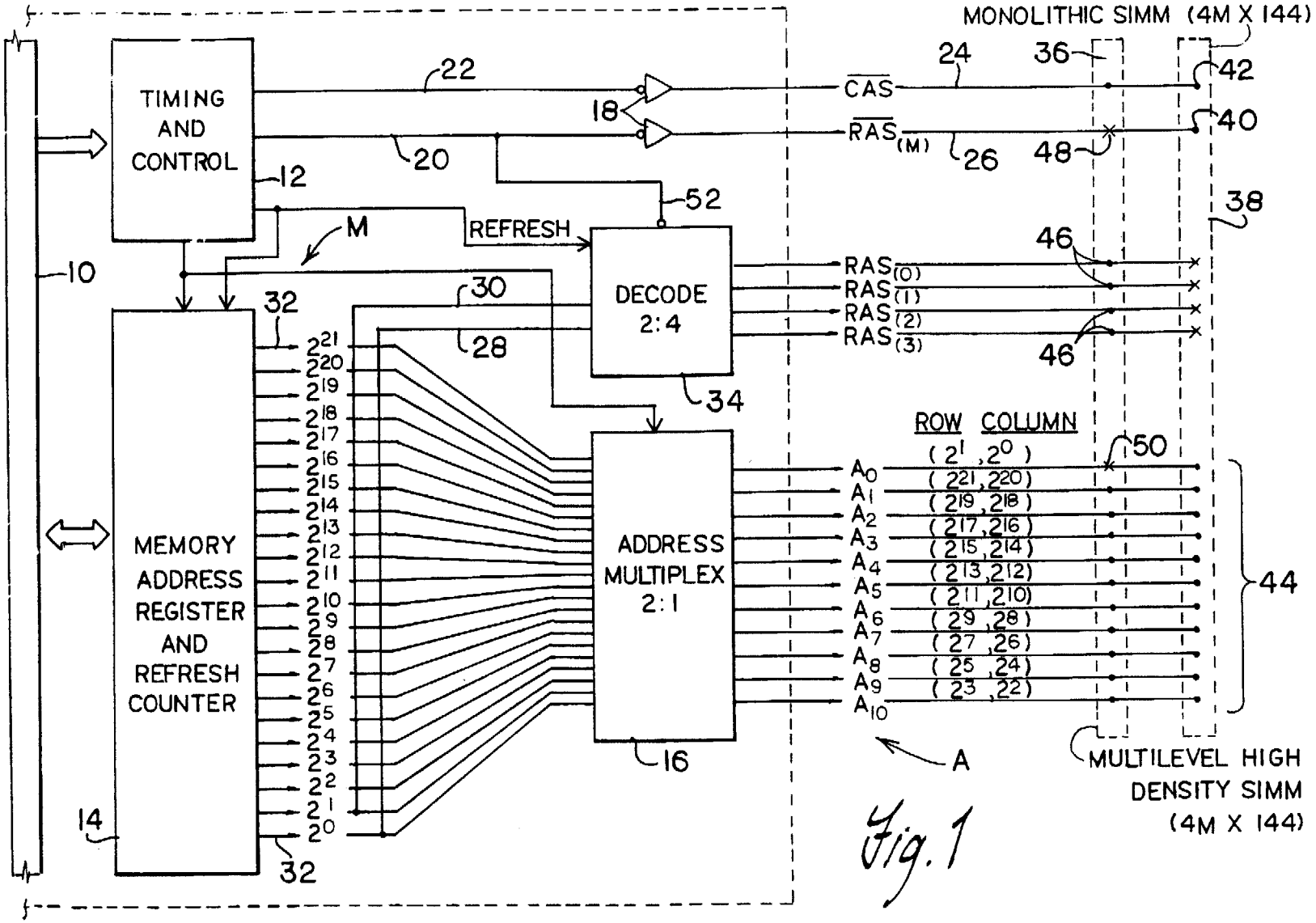
FIG. 1 is a schematic drawing illustrating the system of the present invention configured to utilize the two least significant memory address bits to decode the high-density stack level address.

Referring now to FIG. 1, the letter A designates generally an addressing system according to the present invention. System A includes memory interface circuitry M which typically is provided in personal computer or work station microprocessor based computer systems. Memory interface circuitry M is typically included on a printed circuit board closely associated with the system bus 10 and CPU (not shown).

Memory interface M includes an industry-standard timing and control circuit 12, memory address register and refresh counter 14, address multiplexer 16 and inverter-buffers 18. Timing and control circuit 12 may be in the form of an integrated circuit memory controller chip. The primary purpose of circuit 12 is to provide industry-standard row address strobe (RAS) and column address strobe (CAS) signals at outputs 20 and 22, respectively, which permit standard row and column multiplexed addressing. The CAS and BAS signals are provided as inputs to inverter buffers 18 to provide isolated, inverted CAS and RAS outputs 24 and 26, respectively. Refresh circuitry can be implemented in a variety of ways. In this example, it is controlled by the timing and control circuitry of circuit 12 with addresses generated by the refresh counter of circuit 14. The refresh signal from 12 forces all RAS lines of circuit 34 to be concurrently active.

For the sake of illustration, and not limitation, memory address register 14 is shown in a twenty-two bit configuration, wherein the two least significant output bit lines 28 and 30 are reserved and not used for conventional addressing but are instead used to decode and select one of four memory stack levels to address high-density memory modules or SIMMs. Memory address register 14 is a conventional register circuit which receives address signals via bus 10, stores them, and provides output address signals at multiple address lines 32. During refresh cycles, address signals from the refresh counters are provided at multiple address lines 32.

Inverter-buffers 18 are conventional circuits which are utilized to provide isolation and industry-preferred negative true ($\overline{RAS}$, $\overline{CAS}$) row address strobe and column address strobe signals. Memory interface M also includes a conventional address multiplex circuit 16 which provides 2:1 row and column multiplexed output signals on lines $A_0$ through $A_{10}$ for the twenty-two input address lines.

System A also includes decoder 34, which in the illustrated exemplary system, provides a 2:4 decoding from input lines 28 and 30 to enable one of four $\overline{RAS}$ output lines $RAS_0$, $RAS_1$, $RAS_2$ or $RAS_3$. In industry standard row and column memory multiplexing the $\overline{RAS}$ signal is provided to the memory device before the $\overline{CAS}$ signal. In this scheme, it is the $\overline{RAS}$ signal that energizes the memory device and thus it is the $\overline{RAS}$ signal which creates power demand. The $\overline{CAS}$ signal merely completes the address for the selected location and does not effect power requirements.

System A further includes a plurality of pairs of side-by-side configured SIMM sockets 36 and 38 located conveniently on an expansion board for example, and electrically connected to the previously described elements of system A via address lines $A_0$ through $A_{10}$, $\overline{RAS}$ lines $RAS_0$ through $RAS_3$, and basic $\overline{RAS}$, $\overline{CAS}$ lines 26 and 24, respectively. In the figures an "x" indicates no connection with the SIMM circuitry to the respective line, while a dot indicates a connection. However, all signals are available at each SIMM socket and any SIMM can be plugged into any socket.

For simplicity, only one pair of sockets 36, 38 is illustrated in the figures, but it should be understood that typically a plurality of pairs are provided. Socket 38 is shown with a conventional, monolithic memory element SIMM. Socket 36 is shown with a high-density, four-high stacked memory element, for example, as are currently available from the assignee hereof. Minor changes, such as the addition of four more $RAS_N$ lines from decoding one-of-eight row signals to select one-of-eight memory elements would be necessary to use an eight-high high-density memory element SIMM, together with designation of one more address line from register 14 in addition to lines 28 and 30 for input to decoder 34.

As can be seen in FIG. 1, the conventional SIMM in socket 38 does not interconnect with RAS lines $RAS_0$ through $RAS_3$, but receives conventional row and column addressing signals via connections at pins 40 and 42, respectively. Also, the full field of address lines $A_0$ through $A_{10}$ are connected at pins 44. Typically, at the time of first product introduction not all of address lines $A_0$ through $A_{10}$ are utilized, but connection is provided to accommodate the next generation. A conventional SIMM in socket 38 would operate in industry standard fashion and would not utilize $RAS_0$ through $RAS_3$ inputs.

A conventional sixty-four megabyte SIMM would include capacity for four million addresses, each one hundred-forty-four bits wide. Such a conventional SIMM would typically use thirty-six memory elements, each having four million addresses, with four bits (16 million bits) for each address [(4M×4)×36] yielding 4 million×144 bit storage capacity. In contrast, the high-density sixty-four megabyte SIMM incorporates thirty-six stacked elements, wherein each stack includes four, one-million by four bit (4 million bits) memory elements [(4×1M×4)×36] yielding 4 million×144 bit addresses.

If alternative high-density modules with four, four million by one bit memory elements [(4×4M×1)×36] yielding 4 million×144 bit addresses are used without level select signals $RAS_0$ through $RAS_3$, each of the four high stacked elements in the selected stack would be energized on each access thereby requiring approximately four times as much power as in conventional monolithic SIMMs. Since only one element in each four-high stack is required to be energized during any one memory cycle, the system of the present invention uses the $RAS_0$ through $RAS_3$ decoded inputs to energize only the one level in the selected stack during a memory cycle containing the specified address memory location. In this way, inexpensive high-density SIMMs can be utilized instead of next generation monolithic SIMMs without increasing power consumption.

Referring to FIG. 1, a high-density SIMM is installed in socket 36. One of four level decoding is provided via $\overline{RAS}$ connections at pins 46. The conventional $\overline{RAS}$ signal on connection pin 48 and the address pin $A_0$ at pin 50 are not used by the high-density SIMM.

Assuming both a high-density and a monolithic SIMM are in use in a given system, the simulcast system of the present invention provides a means to address either form of SIMM. Conventional SIMM addressing is carried out using $\overline{RAS}$, $\overline{CAS}$ lines 26 and 24 in combination with address lines $A_0$ through $A_{10}$. High-density SIMM addressing is carried out using $RAS_0$ through $RAS_3$ to select one of four levels, conventional CAS address line 24 and address lines $A_1$ through $A_{10}$. Decode circuit 34 is provided with a RAS input at line 52 to provide correct timing for the decoded one of four $\overline{RAS}$ level select signals.

Figure 2:
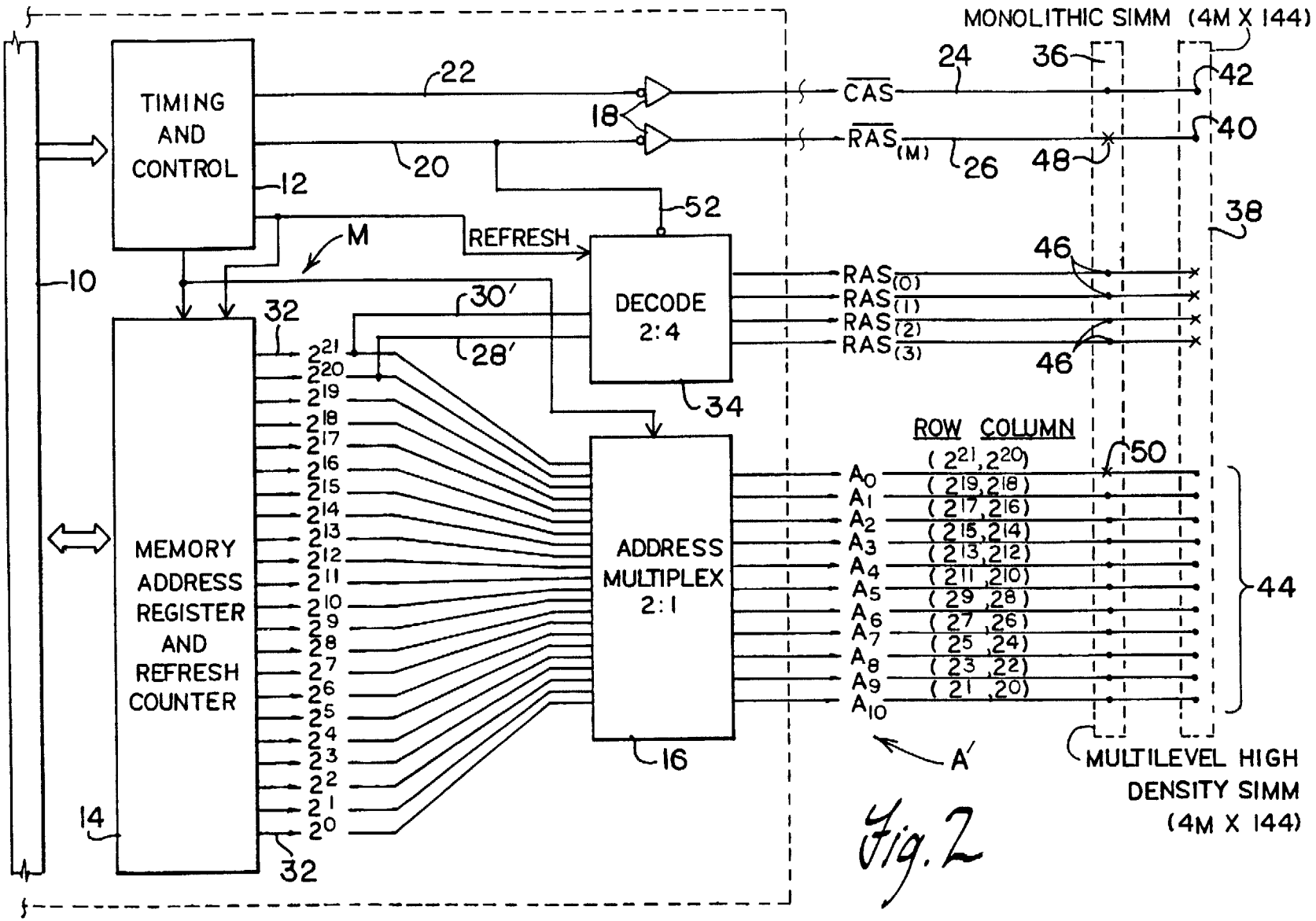
FIG. 2 is a schematic drawing illustrating the system of the present invention configured to utilize the two most significant memory address bits to decode the high-density stack level address.

Turning now to FIG. 2, an alternative embodiment A' is illustrated, wherein like numbers designate similar elements performing similar functions. The only difference in this embodiment is the use of the two most significant address bits for level select decoding.

The foregoing disclosure and description of the preferred embodiment of the invention are illustrative and explanatory thereof, and are not intended to suggest limitation of the invention to the specific embodiment shown. As will be appreciated by those of ordinary skill in the art, various changes in the size, capacity, specific components or circuit elements may be made without departing from the spirit of the invention.

I claim:

1. A memory addressing subsystem for an electronic data processing system of the type including a system bus to communicate a variety of signals between system elements and system memory, said memory addressing subsystem comprising:

a) a memory address register and refresh counter coupled to the system bus for receiving a multiple bit memory address via the system bus, and providing a multiple-bit address output signal in parallel format;

b) a timing and control circuit coupled to the system bus to receive system memory access timing and control input signals and for providing row address strobe, column address strobe and refresh timing and control output signals;

c) an address multiplex circuit coupled to said memory address register to receive said multiple-bit address signal and to provide a multiplexed multiple-bit address output signal in parallel format comprising a row address followed by column address;

d) a memory module level decode circuit, said level decode circuit being coupled to said memory address register for receiving a multiple-bit encoded level select input signal; said level decode circuit also being coupled to said timing and control circuit to receive said row address strobe and refresh control signals as inputs; said level decode circuit providing a multiple-bit memory module level select output signal in response to said inputs;

e) a memory module socket adapted to receive memory modules comprised of either single level memory devices or high-density, multiple-level memory devices;

f) wherein said single level memory devices are coupled to receive said row and column address strobe signals from said timing and control circuit and to receive said multiplexed multiple-bit address output signal from said address multiplex circuit; and g) wherein said high-density, multiple level memory devices are coupled to receive; said column address strobe signal from said timing and control circuit; said multiple-bit memory module level select output signal; and to receive said multiplexed multiple-bit address output signal from said address multiplex circuit.

2. The memory address subsystem of claim 1, wherein said multiple-bit memory module level select output signal provided by said memory module level decode circuit comprises a decoded output level select signal or a multiple output level select signal in the case of a refresh cycle.

3. The memory address subsystem of claim 2, wherein said multiple-bit encoded level select input signal to said memory module level decode circuit comprises the least significant bits of the multiple-bit address output signal from said memory address register.

4. The memory address subsystem of claim 2, wherein said multiple-bit encoded level select input signal to said memory module level decode circuit comprises the most significant bits of the multiple-bit address output signal from said memory address register.

5. The method of addressing system memory, comprising a plurality of memory devices in a multi-level configuration in a computer system of the type including a system bus, a data processor, a system memory interface circuit, a means for generating memory address signals, and a means for generating memory timing and control signals, said system memory addressing method comprising:

a) providing conventional row and column address strobe signals to said system memory;

b) providing multiple-bit address signals to said system memory, said address signals including conventional row and column address specifying bits and also including memory module level select bits;

c) providing a level select signal to said system memory in response to decoding of said memory module level select bits; said level select signal being utilized to select one of said plurality of multi-level commonly coupled memory devices comprising said system memory for access; and d) providing multiple-bit refresh address signals to said system memory, said address signals including conventional refresh row address bits and also including said memory module level select bits.

*6. A memory addressing subsystem for an electronic data processing system of the type including a system bus to communicate a variety of signals between system elements and system memory, said memory addressing subsystem comprising:*

*a) a memory address register and refresh counter coupled to the system bus for receiving a multiple-bit memory address via the system bus, and providing a multiple-bit address output signal expressing a memory address;*

*b) a timing and control circuit coupled to the system bus to receive system memory access timing and control input signals and for providing row address strobe, column address strobe and refresh timing and control output signals;*

*c) an address multiplex circuit coupled to said memory address register to receive said multiple-bit address output signal and to provide a multiplexed multiple-bit address output signal expressing said memory address;*

*d) a memory module decode circuit, said decode circuit arranged to receive an encoded select input signal derived from said memory address; said decode circuit also being coupled to said timing and control circuit to receive said row address strobe said refresh timing and control signals as inputs; said decode circuit providing a multiple-bit memory module select output signal in response to said inputs;*

*e) a memory module socket adapted to receive a memory module and provide said memory module with said multiple-bit memory module select output signal and an address signal set derived from said multiplexed multiple-bit address output signal.*

*7. A memory unit selection system for a computer, said system comprising:*

*a defined memory space having a set of memory addresses;*

*plural memory units designated within said defined memory space;*

*memory interface circuitry for generating a multi-bit memory address signal within the set of memory addresses;*

*a row address strobe generator producing a row address strobe signal in substantial correspondence with a computer access of said defined memory space;*

*a decode circuit responsive to said row address strobe signal to produce one of a set of plural row address unit select strobe output signals to select an individual one of said plural memory units in correspondence with the information content of a unit select signal derived from said multi-bit memory address signal.*

*8. A method for selecting a memory unit within a defined memory space associated with a computer system, said method comprising the steps of:*

*providing a defined memory space having a set of memory addresses;*

*designating plural memory units within said defined memory space;*

*generating a multi-bit memory address signal within said set of memory addresses;*

*deriving a unit select signal set from said multi-bit memory address signal;*

*generating a row address strobe signal in substantial correspondence with a computer system access of said defined memory space;*

*providing a decode circuit having plural row address select strobe signals;*

*conveying said unit select signal set and said row address strobe signal to said decode circuit to generate, at a state change of said row address strobe signal, a selected row address select strobe signal corresponding to a selected memory unit as determined by the information content of said unit select signal set.*

*9. The method of claim 8 wherein said unit select signal set is derived by the decode circuit from said multi-bit memory address signal by decoding the combination of a signifying row address datum and a signifying column address datum received from said multi-bit address memory signal.*

*10. The method of claims 8 or 9 wherein N memory units are designated within said defined memory space and said unit select signal set has X number of bits where:*

$$2^X = N.$$

*11. The method of claim 10 wherein N equals 4 and X equals 2.*

*12. The method of claim 10 wherein N equals 2 and X equals 1.*

* * * * *